(12) United States Patent  (10) Patent No.: US 8,470,627 B2
Ohba et al.  (45) Date of Patent: Jun. 25, 2013

(54) METHOD FOR MANUFACTURING SEMICONDUCTOR LIGHT EMITTING DEVICE

(71) Applicants: Yasuo Ohba, Kanagawa-ken (JP); Kei Kaneko, Kanagawa-ken (JP); Toru Gotoda, Kanagawa-ken (JP); Hiroshi Katsuno, Tokyo (JP); Mitsuhiro Kushibe, Tokyo (JP)

(72) Inventors: Yasuo Ohba, Kanagawa-ken (JP); Kei Kaneko, Kanagawa-ken (JP); Toru Gotoda, Kanagawa-ken (JP); Hiroshi Katsuno, Tokyo (JP); Mitsuhiro Kushibe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/671,580

(22) Filed: Nov. 8, 2012

(65) Prior Publication Data

US 2013/0065340 A1    Mar. 14, 2013

Related U.S. Application Data

(62) Division of application No. 12/507,539, filed on Jul. 22, 2009, now Pat. No. 8,329,489.

(30) Foreign Application Priority Data

Aug. 27, 2008 (JP) ................................. 2008-218028

(51) Int. Cl.
   *H01L 21/00* (2006.01)
(52) U.S. Cl.
   USPC ................. 438/47; 438/29; 438/37; 438/914; 257/E33.001; 257/E33.008

(58) Field of Classification Search
   USPC ...... 438/29, 32, 37, 39, 42, 46; 257/E33.008, 257/94
   See application file for complete search history.

(56) References Cited

U.S. PATENT DOCUMENTS

| 5,831,277 A | 11/1998 | Razeghi |
| 5,990,495 A | 11/1999 | Ohba |
| 6,618,418 B2 | 9/2003 | Northrup et al. |
| 2003/0006409 A1 | 1/2003 | Ohba |
| 2007/0034883 A1 | 2/2007 | Ohba |
| 2007/0246736 A1 | 10/2007 | Senda et al. |
| 2008/0274574 A1 | 11/2008 | Yun |

FOREIGN PATENT DOCUMENTS

| JP | 2000-31588 | 1/2000 |
| JP | 2003-218470 | 7/2003 |
| JP | 2006-80378 | 3/2006 |

(Continued)

OTHER PUBLICATIONS

Katsuno et al., U.S. Appl. No. 12/195,718, filed Aug. 21, 2008.

(Continued)

*Primary Examiner* — Leonard Chang
(74) *Attorney, Agent, or Firm* — Finnegan, Henderson, Farabow, Garrett & Dunner, L.L.P.

(57) ABSTRACT

A method for manufacturing a semiconductor light emitting device is provided. The device includes: an n-type semiconductor layer; a p-type semiconductor layer; and a light emitting unit provided between the n-type semiconductor layer and the p-type semiconductor layer. The method includes: forming a buffer layer made of a crystalline $Al_xGa_{1-x}N$ ($0.8 \leq x \leq 1$) on a first substrate made of c-plane sapphire and forming a GaN layer on the buffer layer; stacking the n-type semiconductor layer, the light emitting unit, and the p-type semiconductor layer on the GaN layer; and separating the first substrate by irradiating the GaN layer with a laser having a wavelength shorter than a bandgap wavelength of GaN from the first substrate side through the first substrate and the buffer layer.

20 Claims, 5 Drawing Sheets

FOREIGN PATENT DOCUMENTS

| | | |
|---|---|---|
| JP | 3803606 | 5/2006 |
| JP | 2006-310851 | 11/2006 |
| JP | 2007-36239 | 2/2007 |
| KR | 2002079659 A | 10/2002 |

OTHER PUBLICATIONS

Kaneko et al., U.S. Appl. No. 12/505,053, filed Jul. 17, 2009.

Chu et al., "Comparison of p-Side Down and p-Side Up GaN Light-Emitting Diodes Fabricated by Laser Lift-Off," Jpn. J. Appl. Phys. (Feb. 15, 2003), 42:L147-L150.

Fuji et al., "Increase in the Extraction Efficiency of GaN-Based Light Emitting Diodes Via Surface Roughening," Applied Physics Letters (Feb. 9, 2004), 84:855-857.

Shchekin et al., "High Performance Thin-Film Flip-Chip InGaN-GaN Light-Emitting Diodes," Applied Physics Letters (2006), 89:071109-1-071109-3.

Notification of Reason(s) for Refusal issued by the Japanese Patent Office on Jun. 15, 2010, for Japanese Patent Application No. 2008-218028, and English-language translation thereof.

Cho et al., "Influence of Mg doping on structural defects in AlGaN layers gown by metalorganic chemical vapor deposition," Applied Physics Letters (2001), vol. 79, No. 23.

METHOD FOR MANUFACTURING SEMICONDUCTOR LIGHT EMITTING DEVICE

CROSS-REFERENCE TO RELATED APPLICATIONS

This is a division of application Ser. No. 12/507,539, filed Jul. 22, 2009, which is incorporated herein by reference.

This application is based upon and claims the benefits of priority from the prior Japanese Patent Application No. 2008-218028, filed on Aug. 27, 2008; the entire contents of which are incorporated herein by reference.

BACKGROUND OF THE INVENTION

1. Field of the Invention

The present invention relates to a method for manufacturing a semiconductor light emitting device.

2. Background Art

A GaN-based mixed crystal such as AlGaInN and the like has a large bandgap of a direct transition type, and is used as a material for light emitting devices (for example, LED: light emitting diode) of short wavelength.

Currently, since there is no good substrate which is lattice-matched with a GaN-based mixed crystal, a method is used for convenience that grows a GaN-based mixed crystal on a sapphire substrate via a low-temperature-grown amorphous layer or a polycrystal-form buffer layer.

At this time, nearly half of the emitted light is reflected at the interface between the sapphire and the GaN-based mixed crystal because there is a difference in refractive index between the sapphire and the GaN-based mixed crystal, causing a decrease in efficiency. Accordingly, a method in which the substrate is separated by an irradiation of a high-power laser with a short wavelength from the sapphire side to decompose the GaN facing the substrate is tried.

However, this method causes damage of the device structure unit due to heat and/or stress during the laser irradiation, and therefore decreases efficiency and/or generates high-density threading dislocations due to lattice mismatching, leading to degradation of device characteristics. Further, a crack easily occurs because of residual strain, causing a decrease in yield.

These problems are significant particularly for an ultraviolet region of wavelengths shorter than 400 nm (nanometers) in which crystal defects often influence efficiency, even in a region of wavelengths longer than 370 nm in which the light is not so absorbed by GaN.

Japan Patent No. 3803606 discloses a method that forms a thermal-diffusion control layer having a lower thermal conductivity than a group-III nitride semiconductor which forms a first semiconductor layer, and irradiates light beam which is absorbed in the first semiconductor layer to decompose the first semiconductor layer.

SUMMARY OF THE INVENTION

According to an aspect of the invention, there is provided a method for manufacturing a semiconductor light emitting device, the device including: an n-type semiconductor layer; a p-type semiconductor layer; and a light emitting unit provided between the n-type semiconductor layer and the p-type semiconductor layer, the method including: forming a buffer layer made of a crystalline $Al_xGa_{1-x}N$ ($0.8 \leq x \leq 1$) on a first substrate made of c-plane sapphire and forming a GaN layer on the buffer layer; stacking the n-type semiconductor layer, the light emitting unit, and the p-type semiconductor layer on the GaN layer; and separating the first substrate by irradiating the GaN layer with a laser having a wavelength shorter than a bandgap wavelength of GaN from the first substrate side through the first substrate and the buffer layer.

DETAILED DESCRIPTION OF THE INVENTION

Embodiments of the present invention will now be described with reference to the drawings.

The drawings are schematic or conceptual; and the relationships between the thickness and width of portions, the proportions of sizes among portions, and the like are not necessarily the same as the actual values thereof. Further, the dimensions and proportions may be illustrated differently among drawings, even for identical portions.

In the specification and drawings, components similar to those described in regard to a drawing thereinabove are marked with like reference signs, and a detailed description is omitted as appropriate.

Embodiments

Figure 1:
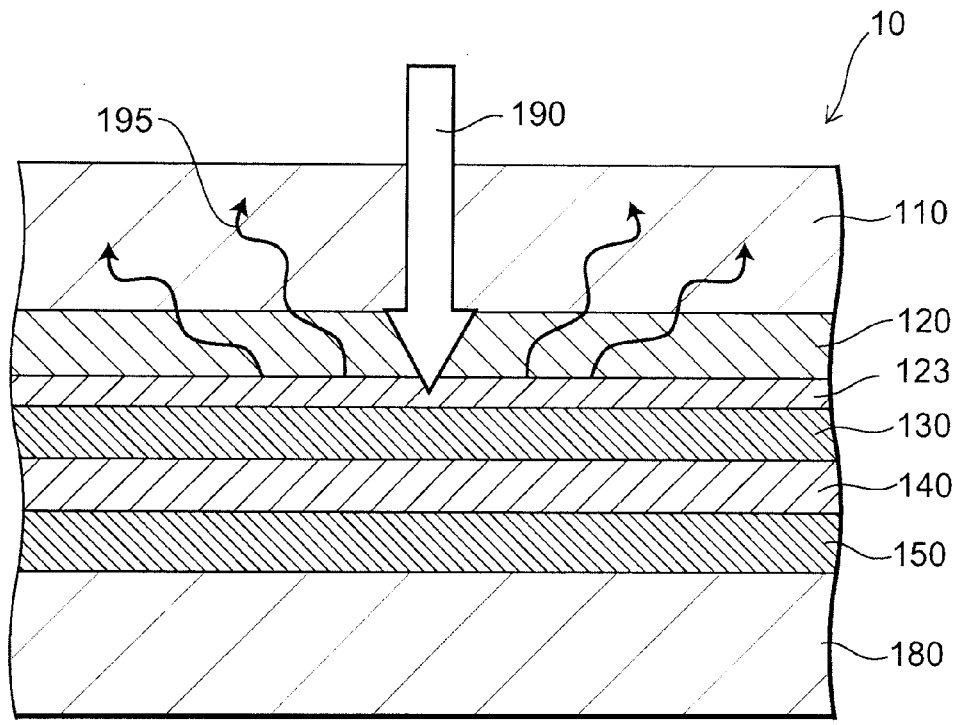
FIG. 1 is a schematic cross-sectional view illustrating a method for manufacturing a semiconductor light emitting device according to an embodiment of the present invention.

FIG. 1 is a schematic cross-sectional view illustrating a method for manufacturing a semiconductor light emitting device according to an embodiment of the present invention.

Figure 2:
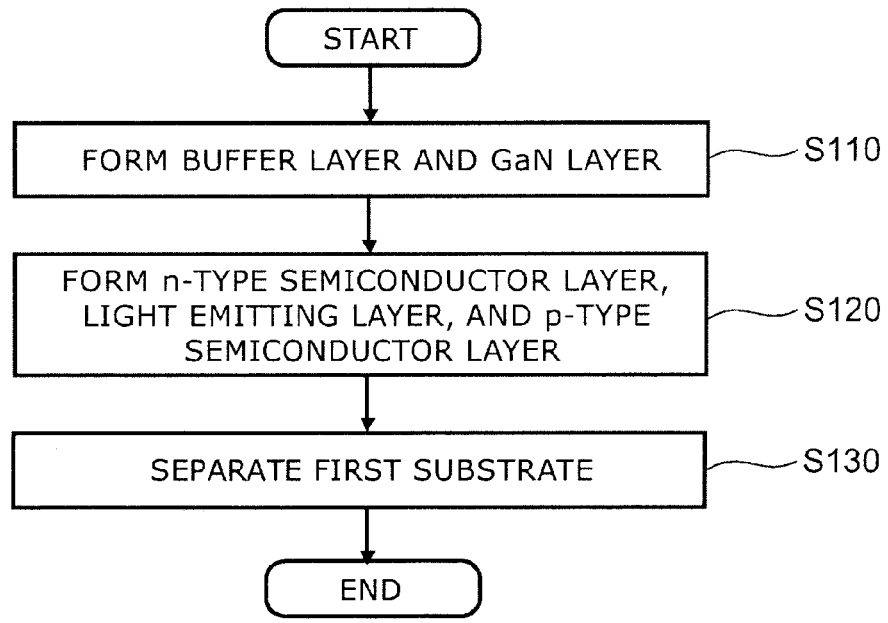
FIG. 2 is a flowchart illustrating the method for manufacturing a semiconductor light emitting device according to the embodiment of the present invention.

FIG. 2 is a flowchart illustrating the method for manufacturing a semiconductor light emitting device according to the embodiment of the present invention.

As shown in FIG. 1, a semiconductor light emitting device manufactured by the method for manufacturing a semiconductor light emitting device according to the embodiment of the present invention includes an n-type semiconductor layer 130, a p-type semiconductor layer 150, and a light emitting unit 140 provided between the n-type semiconductor layer 130 and the p-type semiconductor layer 150.

As shown in FIG. 1 and FIG. 2, in the method for manufacturing the semiconductor light emitting device according to the embodiment, first a buffer layer 120 made of crystalline $Al_xGa_{1-x}N$ ($0.8 \leq x \leq 1$) and a GaN layer 123 are stacked on a first substrate 110 made of c-plane sapphire (step S110). That is, the buffer layer 120 is formed on the first substrate 110 and the GaN layer 123 is formed on the buffer layer 120.

Then, the n-type semiconductor layer 130, the light emitting unit 140, and the p-type semiconductor layer 150 are stacked on the GaN layer 123 (step S120).

A p-side electrode 160 (not shown) may be formed on a side of the p-type semiconductor layer 150 opposite to the light emitting unit 140, for example.

A second substrate 180 may be bonded on the side of the p-type semiconductor layer 150 opposite to the light emitting unit 140, namely, for example, on the p-side electrode 160.

Subsequently, the GaN layer 123 is irradiated with a laser 190 having a wavelength shorter than a bandgap wavelength of GaN from the first substrate 110 side through the first substrate 110 and the buffer layer 120 to separate the first substrate 110 (step S130). The bandgap wavelength of GaN is defined by a bandgap energy of GaN.

A harmonic wave of a vanadium-oxide-type solid laser with a wavelength of 355 nm, for example, may be used for the laser 190. The laser 190 passes through the first substrate 110 made of sapphire and the buffer layer 120, and is absorbed in the GaN layer 123 proximal to the interface with the buffer layer 120. The generated heat partially decomposes the GaN layer 123. Consequently, the first substrate 110 is separated from the light emitting unit 140 side.

Thereby, crystal damage during the separation of the first substrate 110 made of sapphire is suppressed, and therefore a method for manufacturing a semiconductor light emitting device of short wavelength with a high yield, low cost, and high efficiency is provided.

In conventional art, a GaN layer is grown via a low-temperature-grown amorphous layer or a polycrystal-form buffer layer. More specifically, the low-temperature-grown amorphous layer or the polycrystal-form buffer layer is inserted between the GaN layer and the substrate. When the GaN layer is irradiated with a laser from the substrate side in such a configuration, the generated heat is transferred to the light emitting unit 140 side because the thermal conductivities of the sapphire and the buffer layer are much lower than that of the GaN layer. Accordingly, efficiency easily decreases due to the crystal damage.

In contrast, in the method for manufacturing the semiconductor light emitting device according to the embodiment, the crystalline buffer layer 120 made of $Al_xGa_{1-x}N$ with high thermal conductivity is provided between the first substrate 110 and the GaN layer 123. Accordingly, heat 195 generated during the irradiation of the GaN layer with the laser 190 from the first substrate 110 side rapidly diffuses to the buffer layer 120 side. Thereby, the decrease in efficiency due to crystal damage can be prevented even when a high-power laser is used. Therefore, the decrease in efficiency due to crystal damage can be suppressed.

In other words, a process time can be reduced because problems such as a decrease in emitting efficiency can be avoided even when a high-power laser is used.

Further, since a laser with a wavelength longer than 350 nm which is not so absorbed in the GaN layer 123 can be used so that a process-denatured portion is not localized in a thin region, processing strain is relaxed, the defects such as cracks are reduced, and the yield is increased.

As described above, the embodiment provides a method for manufacturing a semiconductor light emitting device of short wavelength with high productivity and high efficiency while suppressing crystal damage during the separation of the sapphire substrate.

The inventors have found out that, by forming a high-temperature-grown layer containing high-concentration carbon or hydrogen on the first substrate 110 in place of the conventional low-temperature-grown AlN, GaN, or the like, a thick AlGaN or AlN film with a high-Al composition can be formed thereon, the crystal quality of the GaN layer growing thereon can be significantly improved, and a light emitting device with high efficiency can be fabricated. When the GaN layer 123 of a device wafer fabricated by using this method is irradiated with the laser 190 from the first substrate 110 side, thermal damage to the device structure unit is suppressed because the generated heat is rapidly absorbed in the AlN or AlGaN having high thermal conductivity, and the generation of cracks due to the thermal stress is also suppressed because there are few defects in the GaN layer.

More specifically, during the formation of the buffer layer in the method for manufacturing the semiconductor light emitting device according to the embodiment, a first buffer layer containing carbon and a second buffer layer having a lower carbon concentration than the first buffer layer are stacked on the first substrate 110.

Thereby, the damage during the separation of the substrate by the laser irradiation can be reduced, and therefore a light emitting device of, in particular, an ultraviolet region with wavelengths shorter than 400 nm can be manufactured with a high yield and low cost, which has been seen as difficult to manufacture. Thereby, a peak wavelength of emitted light of the light emitting unit 140 of the semiconductor light emitting device 10 manufactured by the method according to the embodiment of the present invention can be longer than 370 nm and shorter than 400 nm.

The crystalline buffer layer 120 made of $Al_xGa_{1-x}N$ with high thermal conductivity is formed at high temperatures of, for example, 1100° C. or higher.

In the specification of the present application, a "crystalline" state means a state of neither amorphous nor polycrystalline.

FIRST EXAMPLE

A first example according to the embodiment will now be described.

Figure 3:
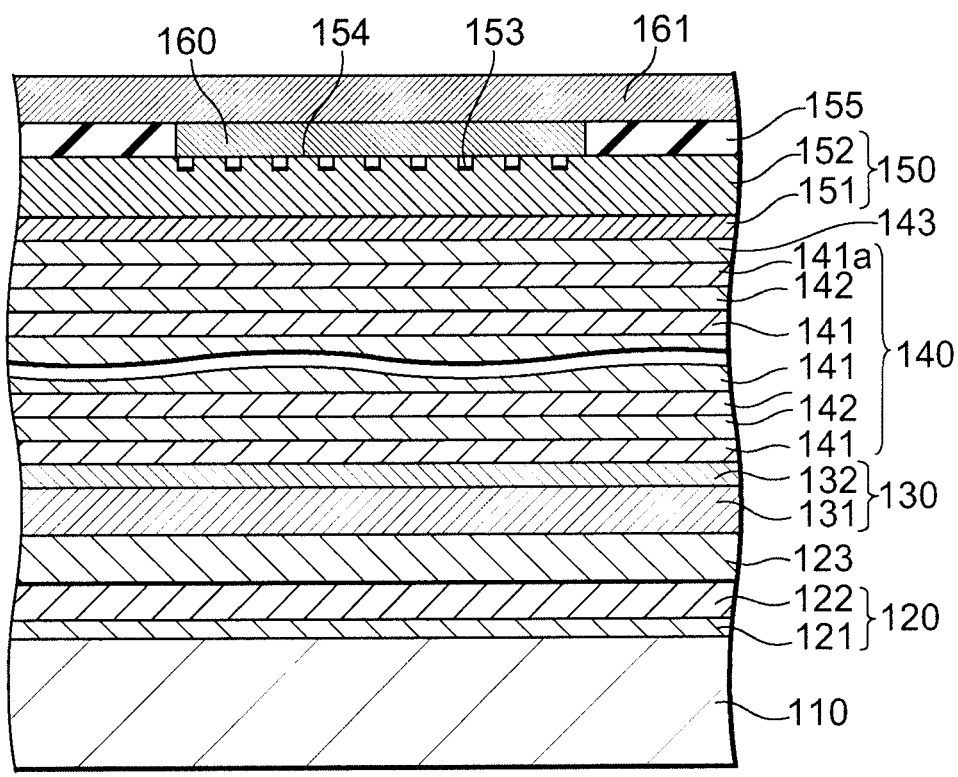
FIG. 3 is a schematic cross-sectional view in order of the steps, illustrating a method for manufacturing a semiconductor light emitting device according to a first example of the present invention.

FIG. 3 is a schematic cross-sectional view in order of the steps, illustrating a method for manufacturing a semiconductor light emitting device according to a first example of the present invention.

Figure 4:
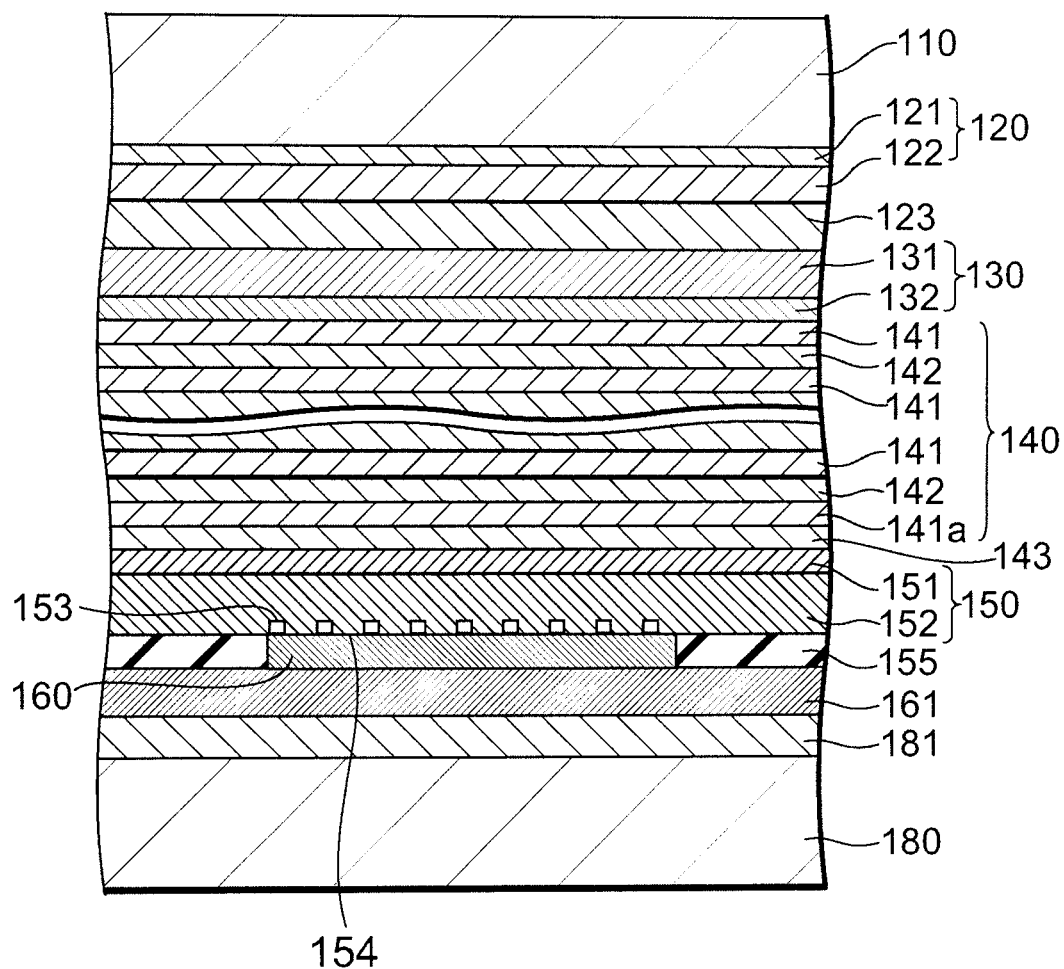
FIG. 4 is a schematic cross-sectional view in order of the steps following FIG. 3.

FIG. 4 is a schematic cross-sectional view in order of the steps following FIG. 3.

Figure 5:
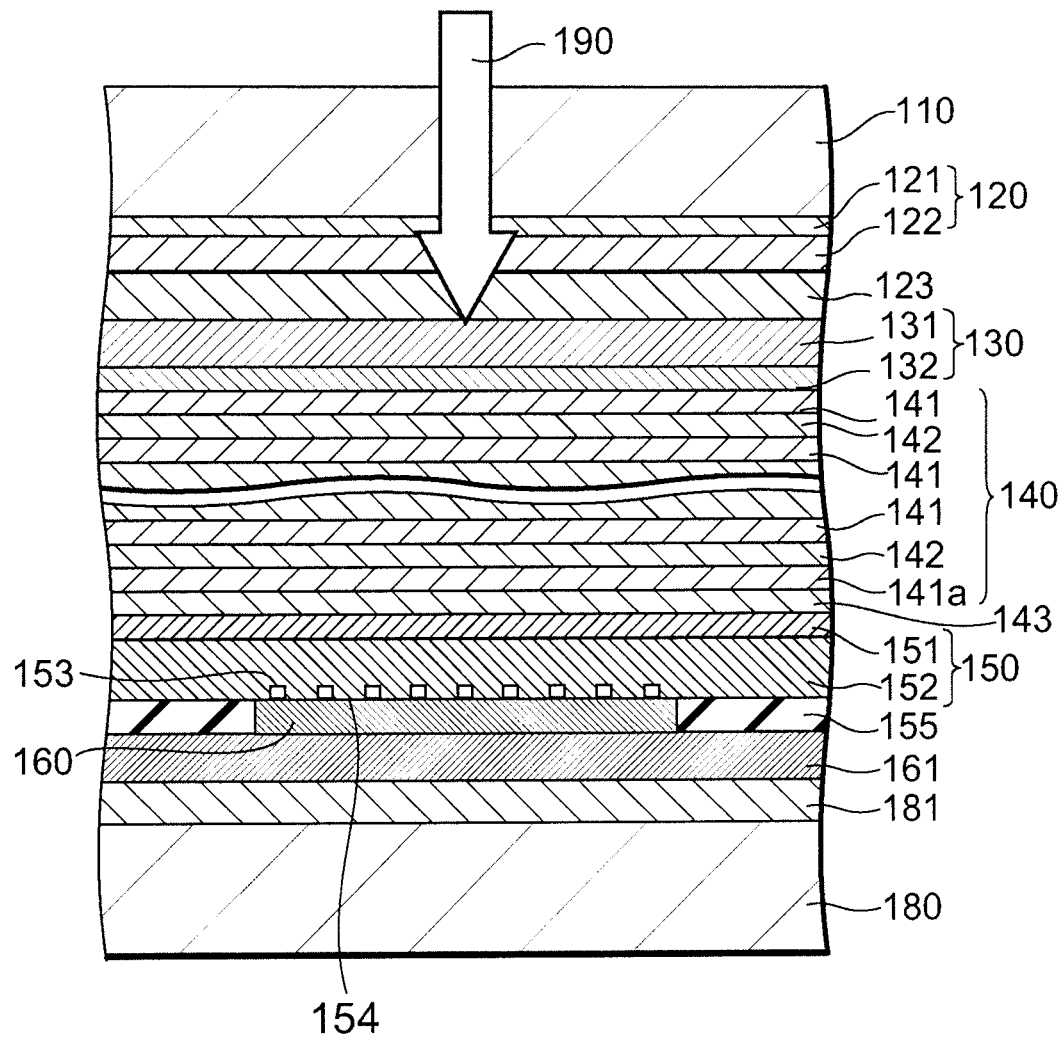
FIG. 5 is a schematic cross-sectional view in order of the steps following FIG. 4.

FIG. 5 is a schematic cross-sectional view in order of the steps following FIG. 4.

As shown in FIG. 3, firstly, a first buffer layer 121, a second buffer layer 122, a GaN layer (a lattice relaxation layer) 123, an n-type contact layer 131, an n-type cladding layer 132, a light emitting unit 140, a spacer layer 143, a p-type cladding layer 151, and a p-type contact layer 152 are sequentially stacked on a first substrate 110 of which a surface is a sapphire c-plane, by using metalorganic chemical vapor deposition.

In the above, the first buffer layer 121 is a high-carbon-concentration portion. It may be based on AlN, for example, and have a carbon concentration of $3 \times 10^{18}$ cm$^{-3}$ to $5 \times 10^{20}$ cm$^{-3}$ and a layer thickness of 3 nm to 20 nm, for example.

The second buffer layer 122 may be based on high-purity AlN, for example, and have a carbon concentration of $1 \times 10^{16}$ cm$^{-3}$ to $3 \times 10^{18}$ cm$^{-3}$ and a layer thickness of 0.6 μm (micrometers) to 6 μm, for example.

The GaN layer (the lattice relaxation layer) 123 may be based on non-doped GaN, and have a layer thickness of 2 μm, for example.

The n-type contact layer 131 may be based on Si-doped n-type GaN, and have an Si concentration of $1 \times 10^{19}$ cm$^{-3}$ to $2 \times 10^{19}$ cm$^{-3}$ and a layer thickness of 4 μm, for example.

The n-type cladding layer 132 may be based on Si-doped n-type $Al_{0.13}Ga_{0.8}N$, for example, and have an Si concentration of $2\times10^{18}$ cm$^{-3}$ and a layer thickness of 0.02 μm, for example.

The light emitting unit 140 may include: a multiple-quantum-well structure with barrier layers 141 and well layers 142 which are alternately stacked at six times; and a terminal barrier layer 141a.

The barrier layer 141 may be based on Si-doped n-type $Al_{0.065}Ga_{0.93}In_{0.005}N$, for example, and have an Si concentration of $1.1\times10^{19}$ to $3.0\times10^{19}$ cm$^{-3}$ and a layer thickness of 13.5 nm, for example.

The well layer 142 may be based on GaInN, for example, and have an emission wavelength of 375-385 nm and a layer thickness of 4.5 nm, for example.

The terminal barrier layer 141a may be based on Si-doped n-type $Al_{0.065}Ga_{0.93}In_{0.005}N$, for example, and have an Si concentration of $1.1\times10^{19}$ to $3.0\times10^{19}$ cm$^{-3}$ and a layer thickness of 4.5 nm, for example.

The spacer layer 143 may be based on low-Si-concentration $Al_{0.065}Ga_{0.93}In_{0.005}N$, for example, and have an Si concentration of $1\times10^{16}$ cm$^{-3}$ to $3.0\times10^{18}$ cm$^{-3}$ and a layer thickness of 4.5 nm, for example.

The p-type cladding layer 151 may be based on Mg-doped p-type $Al_{0.24}Ga_{0.76}N$, for example, and have an Mg concentration of $1.8\times10^{19}$ cm$^{-3}$ on the spacer layer 143 side and $1\times10^{19}$ cm$^{-3}$ on the side opposite to the spacer layer 143, and a layer thickness of 24 nm, for example.

The p-type contact layer 152 may be based on Mg-doped p-type GaN, for example, and have an Mg concentration of $8\times10^{18}$ cm$^{-3}$ on the p-type cladding layer 151 side and $5\times10^{19}$ to $9\times10^{19}$ cm$^{-3}$ on the side opposite to the p-type cladding layer 151, and a layer thickness of 0.05-0.3 μm, for example.

The buffer layer 120 illustrated in FIG. 1 includes the first buffer layer 121 and the second buffer layer 122.

The n-type semiconductor layer 130 illustrated in FIG. 1 includes the n-type contact layer 131 and the n-type cladding layer 132.

The p-type semiconductor layer 150 illustrated in FIG. 1 includes the p-type cladding layer 151 and the p-type contact layer 152.

Subsequently, depressions 153 are formed on the surface of the p-type contact layer 152 at spacings of about 0.1 μm which is not longer than the wavelength of the light emitted from the light emitting unit 140. The depressions 153 have a width of about 0.02 μm and a depth of about 0.1 μm, for example. Thus, projections 154 or depressions 153 are formed on the surface of the p-type contact layer 152 at a spacing which is not longer than the wavelength of the light emitted from the light emitting unit 140. The spacing is an average spacing of the projections 154 or an average spacing of the depressions 153.

For example, the depressions 153 may be formed by vapor-phase etching by using a polymer film with a self-aligning function as a patterning mask, in addition to by lithography. Forming the depressions 153 can improve the efficiency of light extraction, and enhance the adhesion of a silver electrode which is hard to form an alloy and easily removed.

Then, an $SiO_2$ film is stacked with a thickness of 400 nm over the semiconductor layer by using, for example, a thermal CVD apparatus.

Subsequently, to form a p-side electrode 160, first a patterned resist for a resist-lift-off process is formed on the semiconductor layer, and the $SiO_2$ film on the p-type contact layer 152 is removed by a treatment with ammonium hydrogen fluoride. In the region where the $SiO_2$ film is removed, an Ag film of a reflecting electrode serving as the p-side electrode 160 is formed with a film thickness of 200 nm by using a vacuum evaporation apparatus. Then, a sinter treatment is performed for one minute under a nitrogen gas atmosphere at 350° C. Thus, the p-side electrode 160 mainly made of silver and a dielectric film 155 (an $SiO_2$ film) provided therearound which has a function of a passivation film as well are formed on the wafer.

After that, a pad layer 161 mainly made of gold is formed on the surface of the p-side electrode 160 and the dielectric film 155 (the $SiO_2$ film) to cover the p-side electrode 160 and the dielectric film 155 (the $SiO_2$ film).

As illustrated in FIG. 4, an Si substrate serving as a second substrate 180 on which a conductive layer 181 made of gold was previously provided by, for example, vapor deposition is disposed so that the conductive layer 181 and the pad layer 161 may be opposed to each other. Then, these components are pressure-bonded to each other while heating them. Thereby, a stacked body including the light emitting unit 140 and the second substrate 180 composed of the Si substrate are bonded to each other. That is, the second substrate 180 is bonded on the side of the p-type semiconductor layer 150 opposite to the light emitting unit 140.

At this time, a crack and the like usually easily occur due to a difference in thermal expansion between Si and GaN, and a difference in residual stress between the protective film (the dielectric film 155) and the electrode materials (the p-side electrode 160, the metal (conductive layer) 181, and the pad layer 161). However, since this example uses a crystal with low threading dislocation concentration, such a problem does not occur.

Then, as shown in FIG. 5, pulsed light of a vanadium-oxide-based solid laser (355 nm) as the laser 190 is irradiated from the first substrate 110 side while scanning. The laser is transmitted through the first substrate 110 made of sapphire and the buffer layer 120 (the first buffer layer 121 and the second buffer layer 122) made of AlN, and absorbed in the GaN layer 123 proximal to the interface with the buffer layer 120. The GaN layer 123 is decomposed partially by the generated heat.

Subsequently, the decomposed portion is removed by a treatment with warm hydrochloric acid and the like, and the first substrate 110 made of sapphire is separated.

In the case where a wafer with a GaN layer formed therein via an ordinary low-temperature-grown buffer layer of thin film is irradiated with a laser, the generated heat is transferred to the light emitting unit 140 side because the thermal conductivity of sapphire is much lower than that of the GaN layer. Therefore, efficiency easily decreases due to the crystal damage.

In contrast, in the method for manufacturing the semiconductor light emitting device of the example, the AlN layer (the first buffer layer 121 and the second buffer layer 122) with high thermal conductivity is formed on the first substrate 110 side. Accordingly, the generated heat rapidly diffuses to the AlN layer side. Therefore, problems such as a decrease in emitting efficiency do not occur even when a high-power laser is used, and a processing time can be reduced. Further, because a laser with a wavelength longer than 350 nm which is not so absorbed in the GaN layer 123 can be used so that the process-denatured portion is not localized in a thin region, processing strains are relaxed, and defects such as cracks are reduced.

In the example, the first buffer layer 121 relaxes the difference in crystal type with the first substrate 110, and in particular reduces screw dislocations.

The surface of the second buffer layer 122 is planarized at the atomic level. Therefore, defects in the GaN layer (the lattice relaxation layer) 123 growing thereon are reduced. To reduce the defects, it is preferable that the second buffer layer 122 has a film thickness of more than 0.8 µm. In addition, to prevent a warpage due to strain, it is preferable that the second buffer layer 122 has a film thickness of not more than 4 µm. From the viewpoint of repeatability and productivity, it is more preferable that the second buffer layer 122 has a film thickness of 1.5-3 µm.

The second buffer layer 122 is preferably based on AlN in regard to thermal conductivity. However, $Al_xGa_{1-x}N$ ($0.8 \leq x \leq 1$) may also be used, which can compensate a warpage of the wafer by adjusting the Ga content and is favorable to a large-scale wafer.

The GaN layer (the lattice relaxation layer) 123 functions to reduce defects and relax strain by growing in the form of a three-dimensional island on the second buffer layer 122. To planarize the surface of growth, the lattice relaxation layer 123 needs to have an average film thickness of 0.6 µm or more. From the viewpoint of repeatability and productivity, it is preferable that the lattice relaxation layer 123 has a film thickness of 0.8 µm to 2 µm.

Employing the buffer layer 120 (the first buffer layer 121 and the second buffer layer 122) and the GaN layer (the lattice relaxation layer) 123 can decrease the density of dislocation to 1/10 or less compared to conventional low-temperature-grown buffer layers.

This allows crystal growth at a high temperature, which are usually difficult to use because of anomalous growth, and at a high ratio of (a supply rate of group V atoms)/(a supply rate of group III atoms). Therefore, the generation of point defects is suppressed, and high-concentration doping to AlGaN and the barrier layer having a high-Al composition is possible.

In this example, to obtain high-efficiency light emitting in the ultraviolet region while utilizing the advantage of a low-defect crystal, various schemes that enable to employ the p-type cladding layer 151 with a high-Al composition and a thick film thickness are adopted in order to increase efficiency of the light emitting unit 140 itself and prevent electrons from overflowing from the light emitting unit 140.

By doping the barrier layer 141 with high-concentration Si and increasing the electron concentration in the well layer 142, a radiative recombination lifetime is decreased and the efficiency is improved. An Si concentration of not more than $1.1 \times 10^{19}$ $cm^{-3}$ has insufficient effects, and that of not less than $3.0 \times 10^{19}$ $cm^{-3}$ degrades crystal quality.

The spacer layer 143 serves to block the anomalous diffusion due to the drift of Mg atoms into the light emitting unit 140 caused by that the electric field by the built-in potential is concentrated in the p-type cladding layer 151 due to the high Si concentration of the n-type semiconductor layer 130. Thereby, the p-type cladding layer 151 with a high-Al composition can have a low resistance without decreasing reliability and efficiency.

An overflow of electrons into the p-type cladding layer 151 can be suppressed because electron concentration proximal to the interface with the p-type cladding layer 151 decreases. At the same time, although the number of nonradiative recombinations at the interface increases due to an increase in hole concentration proximal to the interface, this loss can be held low because the density of dislocation is low and the barrier layer includes an AlGaInN quarternary mixed crystal (the content of In being 0.3% to 2%).

The Mg concentration of the p-type cladding layer 151 is higher on the light emitting unit 140 side and lower on the p-type contact layer 152 side. This concentration profile cancels the piezoelectric field in the p-type cladding layer 151 inhibiting the injection of holes, decreases operating voltage, and improves the effect of carrier confinement.

If the Mg concentration of the p-type cladding layer 151 proximal to the p-type contact layer 152 is not less than $1 \times 10^{20}$ $cm^{-3}$, a diffusion of Mg into the light emitting unit 140 occurs to decrease efficiency and reliability. If not more than $5 \times 10^{19}$ $cm^{-3}$, the operating voltage increases.

The method for manufacturing the semiconductor light emitting device of the above example uses the conductive Si substrate as a support base member (the second substrate 180) used in the separation process of the first substrate 110. However, the invention is not limited thereto. An insulator such as ceramics and the like also can be used as the second substrate 180 in a similar way, while utilizing the resistance to crack according to the method.

Further, Sn and Ge as well as Si may be used as the n-type dopant. In particular, doping Si can provide a high-concentration n-type contact layer of a thick film, allowing fabricating a device of a low operating voltage through reducing series resistance.

In the aforementioned, the buffer layer 120, the GaN layer 123, the n-type semiconductor layer 130, the light emitting unit 140, and the p-type semiconductor layer 150 are film-formed in the following manner.

First, $NH_3$ gas as a group V material and an organometallic Al compound such as $Al(CH_3)_3$ and $Al(C_2H_5)_3$ as a group III material are introduced into a reaction chamber at a substrate temperature of not lower than 1050° C. and not higher than 1200° C. to grow a first buffer layer 121 made of AlN with uniform crystal orientation on the first substrate 110.

To align the crystal orientation of the first buffer layer 121 made of AlN, it is important to control the ratio of the group V material and the group III material to be supplied. To obtain a high-quality film without vacancies, a first ratio of (a supply rate of group V atoms)/(a supply rate of group III atoms) is set to be not less than 0.7 and not more than 50.

To obtain a sufficient quality with good repeatability, the first ratio is preferably not less than 1.2 and not more than 3.0.

Next, the substrate is heated to a temperature of not lower than 1250° C. and not higher than 1350° C. to grow the second buffer layer 122 made of AlN, after which the surface is planarized. At this time, a second ratio of (a supply rate of group V atoms)/(a supply rate of group III atoms) is set higher than the first ratio for the first buffer layer 121. Thereby, a lateral-direction growth is promoted and defects are reduced and flatness is improved.

In the case where AlGaN is used for the second buffer layer 122, an organometallic Ga compound such as $Ga(CH_3)_3$ or $Ga(C_2H_5)_3$ may be added as the group III material.

More specifically, the first buffer layer 121 is epitaxially grown by low-pressure metalorganic chemical vapor deposition at a first temperature with the first ratio of 0.7 to 50. Then, the second buffer layer 122 is epitaxially grown by metalorganic chemical vapor deposition at a second temperature higher than the first temperature and with the second ratio higher than the first ratio.

Then, the substrate temperature is set not lower than 1100° C. and not higher than 1250° C. to grow the GaN layer (the lattice relaxation layer) 123.

After that, nitride semiconductor layers containing Al, In, Ga, and/or the like which form a device structure unit (the n-type semiconductor layer 130, the light emitting unit 140, and the p-type semiconductor layer 150) are stacked thereon.

At this time, an organometallic Ga compound such as $Ga(CH_3)_3$ and $Ga(C_2H_5)_3$, and an organometallic In compound such as $In(CH_3)_3$ and $In(C_2H_5)_3$ may be used as the group III material, as well as the organometallic Al compound described above.

In this case, for a dopant, Si hydride such as $SiH_4$ and/or an organosilicon compound such as $Si(CH_3)_4$ may be used as an n-type dopant. An organometallic Mg compound such as $Cp_2Mg$ (bis(cyclopentadienyl)magnesium) or $m\text{-}Cp_2Mg$ (bis (methylcyclopentadienyl)magnesium) may be used as a p-type dopant.

Although it has been thought that a heat treatment at a temperature of about 800° C. is necessary to remove hydrogen mixed in the growth layer for increasing the activation rate of the p-type dopant, the generation of N-atom vacancies can be suppressed by the growth with a high ratio of (supply rate of group V atoms)/(supply rate of group III atoms), and therefore inactivation due to hydrogen can be avoided essentially. Further, the degradation of crystal quality due to the heat treatment can be avoided as well.

SECOND EXAMPLE

Figure 6:
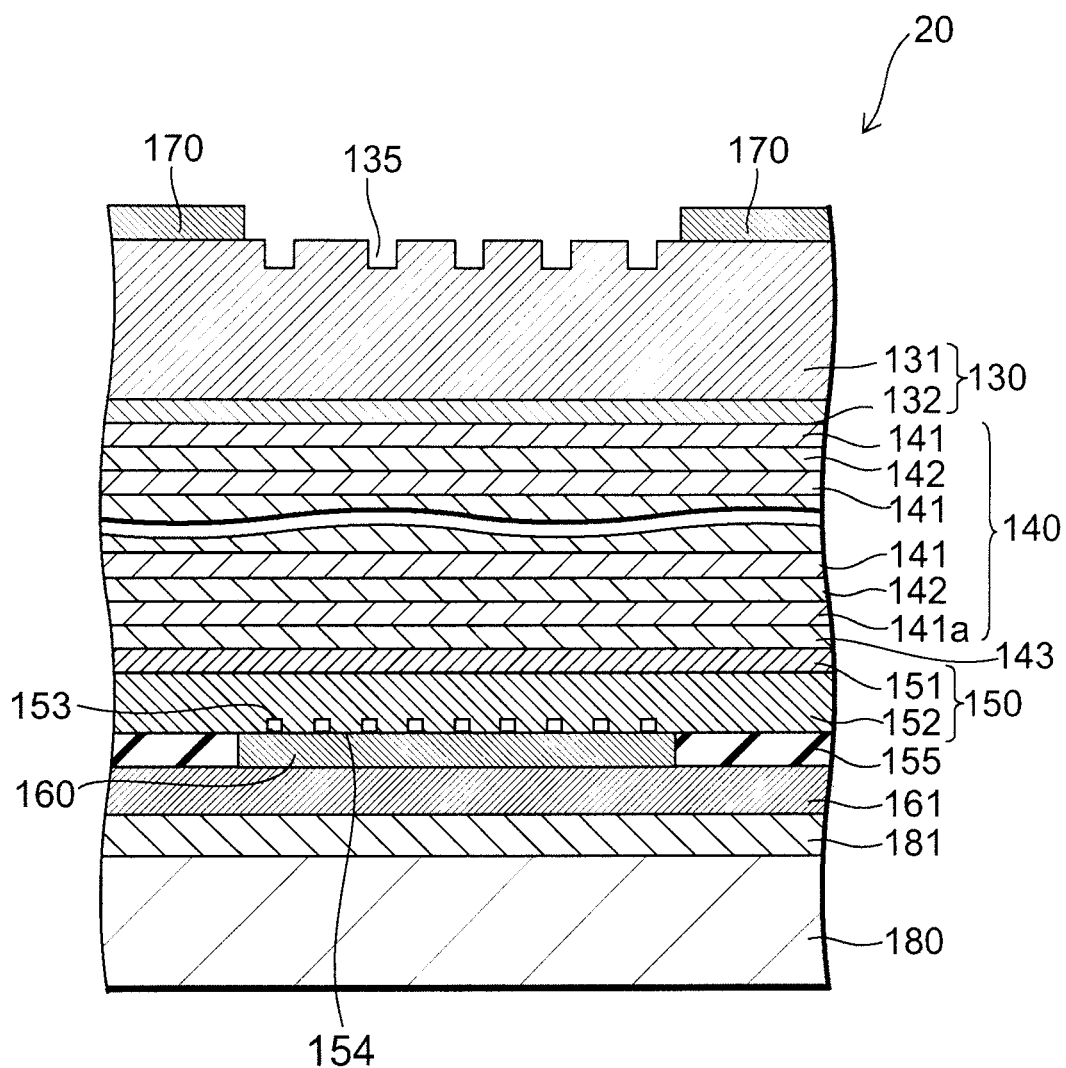
FIG. 6 is a schematic cross-sectional view in order of the steps, illustrating a method for manufacturing a semiconductor light emitting device according to a second example of the present invention.

FIG. 6 is a schematic cross-sectional view in order of the steps, illustrating a method for manufacturing a semiconductor light emitting device according to a second example of the present invention.

As shown in FIG. 6, in the method for manufacturing a semiconductor light emitting device of the second example of the present invention, an n-side electrode 170 is provided on the surface of the n-type semiconductor layer 130 after the first substrate 110 is separated.

More specifically, after the first substrate 110 is separated off, the surface of the n-type semiconductor layer 130 is polished to expose the n-type contact layer 131. Then, an $SiO_2$ film is formed with a thickness of 400 nm by using, for example, a thermal CVD apparatus.

Subsequently, the n-side electrode 170 is formed in the following manner. A patterned resist for resist-lift-off process is formed on the n-type contact layer 131 opposing to a portion in which the p-side electrode 160 is not formed. The $SiO_2$ film on the exposed n-type contact layer 131 is removed by a treatment with ammonium hydrogen fluoride. A stacked film serving as the n-side electrode 170 based on, for example, Ti/Pt/Au is formed with a film thickness of 500 nm in the region where the $SiO_2$ film is removed.

At this time, fine concave and convex 135 may be formed on the surface of the n-type contact layer 131, which can enhance light extraction efficiency. Since the surface of the n-type contact layer 131 has polar characteristics of a surface of nitrogen, a concave and a convex formed resulting from the crystal defects by the reactive ion etching, for example, may be used to form the concave and convex 135.

After that, the workpiece is cut by cleavage, a diamond blade or the like and individual LED devices with a width of 400 µm and a thickness of 100 µm are formed.

Thus, the semiconductor light emitting device 20 illustrated in FIG. 6 can be fabricated.

As described above, the method for manufacturing the semiconductor light emitting device according to this example can suppress crystal damage during the separation of the sapphire substrate, and provide a semiconductor light emitting device of short wavelength with high productivity and high efficiency.

In the specification of this application, the "nitride semiconductor" includes all semiconductors having a chemical formula of $B_xIn_yAl_zGa_{1-x-y-z}N$, where $0 \leq x \leq 1$, $0 \leq y \leq 1$, $0 \leq z \leq 1$, and $x+y+z \leq 1$, while changing the composition ratios x, y, and z in the respective ranges. Further, the "nitride semiconductor" includes those further containing a group V element other than N (nitrogen) and/or any of various dopants added to control the conduction types and the like in the above chemical formula as well.

In the above, the semiconductor light emitting device manufactured by the method for manufacturing the semiconductor light emitting device according to the embodiment of the present invention includes an n-type semiconductor layer, a p-type semiconductor layer, and a light emitting unit provided between the n-type semiconductor layer and the p-type semiconductor layer. Here, a wafer including an n-type semiconductor layer, a p-type semiconductor layer, and a light emitting unit provided between the n-type semiconductor layer and the p-type semiconductor layer also can be regarded as a semiconductor light emitting device for convenience.

Hereinabove, embodiments of the present invention are described with reference to specific examples. However, the present invention is not limited to these examples. For example, those skilled in the art may appropriately select specific configurations of components of the semiconductor light emitting device from known art and similarly practice the present invention. Such practice falls under the scope of the present invention to the extent that similar effects thereto are obtained.

Further, any two or more components of the specific examples may be combined within the extent of technical feasibility. Such combination falls under the scope of the present invention to the extent that the spirit of the present invention is included.

Moreover, all methods for manufacturing a semiconductor light emitting device that can be obtained by an appropriate design modification by those skilled in the art based on the method for manufacturing a semiconductor light emitting device of the embodiment of the present invention described above also are within the scope of the present invention to the extent that the spirit of the present invention is included.

Furthermore, various modifications and alternations within the idea of the present invention will be readily apparent to those skilled in the art. All such modifications and alternations should be seen as within the scope of the present invention.

The invention claimed is:

1. A method for manufacturing a semiconductor light emitting device,
   the device including:
   an n-type semiconductor layer;
   a p-type semiconductor layer; and
   a light emitting unit provided between the n-type semiconductor layer and the p-type semiconductor layer,
   the method comprising:
   forming a first buffer layer made of a crystalline AlN on a first substrate, forming a second buffer layer made of a crystalline $Al_xGa_{1-x}N$ ($0.8 \leq x \leq 1$) on the first buffer layer, and forming a GaN layer on the second buffer layer;
   stacking the n-type semiconductor layer, the light emitting unit, and the p-type semiconductor layer on the GaN layer; and
   separating the first substrate,
   wherein the p-type semiconductor layer includes a first p-type layer provided on the light emitting unit and a p-type contact layer provided on the first p-type layer, and
   the first p-type layer is Mg-doped p-type AlGaN formed to have a concentration profile including a higher Mg concentration on a side of the light emitting unit and a lower Mg concentration on a side opposite to the light emitting unit, so that a piezoelectric field in the first p-type layer is canceled by the concentration profile.

2. The method according to claim 1, wherein the first buffer layer contains carbon and a second buffer layer has a lower carbon concentration than the first buffer layer.

3. The method according to claim 2, wherein the first buffer layer is a layer having a carbon concentration of not less than $3 \times 10^{18}$ cm$^{-3}$ and not more than $5 \times 10^{20}$ cm$^{-3}$, and a thickness of not less than 3 nanometers and not more than 20 nanometers.

4. The method according to claim 2, wherein the second buffer layer is a layer having a carbon concentration of not less than $1 \times 10^{16}$ cm$^{-3}$ and not more than $3 \times 10^{18}$ cm$^{-3}$, and a thickness of not less than 0.6 micrometers and not more than 6 micrometers.

5. The method according to claim 2, wherein:
the first buffer layer is epitaxially grown by low-pressure metalorganic chemical vapor deposition at a first temperature with a first ratio of (a supply rate of group V atoms)/(a supply rate of group III atoms) of 0.7 to 50, and
the second buffer layer is epitaxially grown by metalorganic chemical vapor deposition at a second temperature higher than the first temperature with a second ratio of (a supply rate of group V atoms)/(a supply rate of group III atoms) higher than the first ratio.

6. The method according to claim 1, wherein a total film thickness of the first buffer layer and the second buffer layer is 1 micrometer to 4 micrometers.

7. The method according to claim 1, wherein the first buffer layer and the second buffer layer has a higher thermal conductivity than the GaN layer.

8. The method according to claim 1, wherein the n-type semiconductor layer includes an Si-doped n-type GaN layer provided on the GaN layer, and an Si-doped n-type AlGaN layer provided on the Si-doped n-type GaN layer.

9. The method according to claim 8, wherein the Si-doped n-type GaN layer has a silicon concentration of not less than $1 \times 10^{19}$ cm$^{-3}$ and not more than $2 \times 10^{19}$ cm$^{-3}$, and the Si-doped n-type AlGaN layer has a silicon concentration lower than the silicon concentration of the Si-doped n-type GaN layer.

10. The method according to claim 1, wherein the light emitting unit includes a multiple-quantum-well structure having barrier layers and well layers alternately stacked.

11. The method according to claim 10, wherein the barrier layer is a Si-doped n-type AlGaInN and has a silicon concentration of $1.1 \times 10^{19}$ to $3.0 \times 10^{19}$ cm$^{-3}$.

12. The method according to claim 1, wherein the p-type contact layer is Mg-doped p-type GaN and has a lower Mg concentration on a side of the first substrate than on a side opposite to the first substrate.

13. The method according to claim 1, wherein the device further includes a spacer layer provided between the light emitting unit and the p-type semiconductor layer, and the spacer layer includes AlGaInN and has an Si concentration of $1 \times 10^{16}$ cm$^{-3}$ to $3.0 \times 10^{18}$ cm$^{-3}$.

14. The method according to claim 1, wherein a peak wavelength of emitted light of the light emitting unit is longer than 370 nanometers and shorter than 400 nanometers.

15. The method according to claim 1, wherein a second substrate is bonded on a side of the p-type semiconductor layer opposite to the light emitting unit before the separating the first substrate.

16. The method according to claim 1, wherein an electrode is formed on the side of the p-type semiconductor layer opposite to the fight emitting unit before bonding the second substrate.

17. The method according to claim 1, wherein at least one of projections or depressions is formed on a surface on a side of the p-type semiconductor layer opposite to the light emitting unit at a spacing not longer than a wavelength of emitted light of the light emitting unit.

18. The method according to claim 1, wherein the stacking the n-type semiconductor layer, the light emitting unit, and the p-type semiconductor layer includes growing a crystalline AlGaN served as the first p-type layer included in the p-type semiconductor layer, and a Mg concentration on a side of the light emitting unit is higher than a Mg concentration on a side opposite to the light emitting unit.

19. The method according to claim 1, wherein the stacking the n-type semiconductor layer, the light emitting unit, and the p-type semiconductor layer includes forming the light emitting unit including a barrier layer made of an AlGaInN quarternary mixed crystal having an In component ratio in group III elements not less than 0.3% and not more than 2%.

20. The method according to claim 19, wherein the stacking the n-type semiconductor layer, the light emitting unit, and the p-type semiconductor layer includes growing the AlGaInN quarternary mixed crystal having a Si concentration not less than $1.1 \times 10^{19}$ and not more than $3.0 \times 10^{19}$ cm$^{-3}$.

* * * * *